(12) United States Patent
Seo et al.

(10) Patent No.: US 7,374,979 B2
(45) Date of Patent: May 20, 2008

(54) THIN FILM TRANSISTOR AND METHOD OF FABRICATING THE SAME

(75) Inventors: Jin-Wook Seo, Suwon-si (KR); Ki-Yong Lee, Yongin-si (KR); Tae-Hoon Yang, Seongnam-si (KR); Byoung-Keon Park, Incheon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 11/611,238

(22) Filed: Dec. 15, 2006

(65) Prior Publication Data

US 2007/0087490 A1    Apr. 19, 2007

Related U.S. Application Data

(62) Division of application No. 11/011,586, filed on Dec. 15, 2004.

(30) Foreign Application Priority Data

Aug. 13, 2004    (KR) ............... 2004-64033

(51) Int. Cl.
  *H01L 21/00* (2006.01)
(52) U.S. Cl. ................ 438/151; 438/166
(58) Field of Classification Search ........... 438/151, 438/166, 482, 486, 795
  See application file for complete search history.

(56) References Cited

U.S. PATENT DOCUMENTS 6,197,623 B1 *    3/2001   Joo et al. ............... 438/151
6,815,267 B2 *    11/2004  So ......................... 438/149
2002/0086470 A1   7/2002   Kim et al.

FOREIGN PATENT DOCUMENTS

| CN | 1133489 | 10/1996 |
|---|---|---|
| CN | 1388986 | 1/2003 |
| CN | 1407603 | 4/2003 |
| JP | 08097137 | 4/1994 |
| JP | 10-270363 | 10/1998 |

(Continued)

OTHER PUBLICATIONS

Chinese Office Action dated Jan. 4, 2008.

*Primary Examiner*—Tuan H. Nguyen
(74) *Attorney, Agent, or Firm*—H.C. Park & Associates, PLC

(57) ABSTRACT

A bottom gate thin film transistor and method of fabricating the same are disclosed, in which a channel region is crystallized by a super grain silicon (SGS) crystallization method, including: forming a gate electrode and a gate insulating layer on an insulating substrate; forming an amorphous silicon layer on the gate insulating layer followed by forming a capping layer and a metal catalyst layer; performing heat treatment to crystallize the amorphous silicon layer into a polysilicon layer; and forming an etch stopper, source and drain regions and source and drain electrodes. The thin film transistor includes: an insulating substrate; a gate electrode formed on the substrate; a gate insulating layer formed on the gate electrode; a polysilicon layer formed on the gate insulating layer and crystallized by an SGS crystallization method; and source and drain regions and source and drain electrodes formed in a predetermined region of the substrate.

9 Claims, 7 Drawing Sheets

FOREIGN PATENT DOCUMENTS

| | | |
|---|---|---|
| JP | 11040499 | 2/1999 |
| JP | 2001068680 | 3/2001 |
| JP | 2001135574 | 5/2001 |
| JP | 2002-124683 | 4/2002 |
| JP | 2003-163165 | 6/2003 |
| JP | 2004193624 | 7/2004 |
| KR | 1020000031709 | 6/2000 |
| KR | 1020040070979 * | 8/2004 |

* cited by examiner

THIN FILM TRANSISTOR AND METHOD OF FABRICATING THE SAME

CROSS-REFERENCE TO RELATED APPLICATION

This a application is a divisional of prior application Ser. No. 11/011,586, filed on Dec. 15, 2004, which claims the benefit of Korean Patent Application No. 2004-64033, filed Aug. 13, 2004, which are all hereby incorporated by reference for all purposes as if fully set forth herein.

BACKGROUND OF THE INVENTION

1. Field of the Invention

The present invention relates to a thin film transistor and method of fabricating the same and, more specifically, to a bottom gate thin film transistor and method of fabricating the same having a channel region crystallized by a super grain silicon (SGS) crystallization method by forming a gate electrode and a gate insulating layer on an insulating substrate, forming an amorphous silicon layer on the gate insulating layer followed by forming a capping layer and a metal catalyst layer, performing heat treatment to crystallize the amorphous silicon layer into a polysilicon layer, and forming an etch stopper, source and drain regions and source and drain electrodes.

2. Description of the Related Art

In general, in the thin film transistor used for a display device, a semiconductor layer is formed by depositing amorphous silicon on a transparent substrate such as glass or quartz, dehydrogenating the amorphous silicon, ion-implanting impurities for forming a channel, and then crystallizing the amorphous silicon.

As a method of crystallizing the amorphous silicon into polysilicon, there are a solid phase crystallization method, an excimer laser crystallization method, a metal induced crystallization method and a metal induced lateral crystallization method. In the solid phase crystallization method, the amorphous silicon layer is annealed for several to several tens of hours at a temperature less than 700° C., i.e., a transition temperature of glass that forms a substrate of the display device in which the thin film transistor is used. In the excimer laser crystallization method, an excimer laser is irradiated onto a silicon layer so that the silicon layer is locally heated for a very short time at a high temperature to crystallize. In the metal induced crystallization method, metal such as Ni, Pd, Ag, or Al is in contact with or injected into the amorphous silicon layer so that a phenomenon that phase change of the amorphous silicon into the polysilicon is derived by the metal is used. In the metal induced lateral crystallization method, silicon is crystallized in a manner that silicide that is generated by reacting metal with silicon is laterally propagated to induce crystallization of the silicon.

FIGS. 1A and 1B are cross-sectional views illustrating a fabrication process of a conventional thin film transistor;

FIG. 1A is a cross-sectional view of a fabrication process of a top-gate thin film transistor. As shown in FIG. 1A, a buffer layer 12 is formed to prevent penetration of gas or moisture into an insulating substrate 11 such as glass or plastic, and an amorphous silicon layer is formed on the buffer layer 12.

After crystallizing the amorphous silicon layer by the aforementioned crystallization process, the amorphous silicon layer is patterned to form a semiconductor layer 13 having a polysilicon layer, and a gate insulating layer 14 is formed in a single or double layer of a silicon oxide layer or a silicon nitride layer.

A gate electrode 15 is then formed of a conductive material on the substrate, and an interlayer insulating layer 16 is formed of an insulating layer.

Next, a contact hole opening a predetermined region of the semiconductor layer is formed by etching a predetermined region of a gate insulating layer and the interlayer insulating layer, and then source and drain electrodes 17 are formed to complete the top-gate thin film transistor.

FIG. 1B is a cross-sectional view of a fabrication process of a bottom-gate thin film transistor. As shown in FIG. 1B, a buffer layer 22 is formed on an insulating substrate 21 such as glass or plastic, and a metal material is formed on the entire surface of the substrate and patterned to form a gate electrode 23.

Next, a gate insulating layer 24 is formed on the entire surface of the substrate in a single or double layer of a silicon oxide layer or a silicon nitride layer.

Next, an amorphous silicon layer is deposited on the entire surface of the substrate, and patterned to form an amorphous silicon layer pattern 25.

An insulating layer is then formed on the entire surface of the substrate and patterned to form an etch stopper 26 over a channel region of the amorphous silicon layer pattern 25.

Next, a highly doped amorphous silicon layer is formed on the entire surface of the substrate, and patterned using a photoresist pattern and the etch stopper, so that a highly doped amorphous silicon layer pattern 27 is formed to define source and drain regions.

Next, a conductive metal is deposited on the entire surface of the substrate and patterned using the photoresist pattern and the etch stopper to form source and drain electrodes 28, so that the bottom-gate thin film transistor is finally obtained.

The aforementioned top-gate thin film transistor has merits in that the semiconductor layer having the polysilicon layer is formed by various crystallization methods so that an on/off rate of the thin film transistor is fast and electron mobility is high. However, the top-gate thin film transistor has a drawback in that the fabrication process is complicated. Moreover, an interface between the gate insulating layer and the semiconductor layer is exposed so that it is susceptible to contamination or defects. On the contrary, the bottom gate thin film transistor has merits in that the fabrication process is simple and the interface between the gate insulating layer and the channel region is not exposed. However, the bottom gate thin film transistor has drawbacks in that the operating speed and electron mobility are low because the channel region is made of the amorphous silicon layer due to difficulty in crystallization.

SUMMARY OF THE INVENTION

The present invention, therefore, solves aforementioned problems associated with conventional devices by providing a bottom gate thin film transistor and method of fabricating the same having a channel region crystallized by an SGS crystallization method by forming a gate electrode and a gate insulating layer on an insulating substrate; forming an amorphous silicon layer on the gate insulating layer followed by forming a capping layer and a metal catalyst layer; performing heat treatment to crystallize the amorphous silicon layer into a polysilicon layer; and forming an etch stopper, source and drain regions and source and drain electrodes, thereby having merits for both a top-gate thin film transistor and a bottom-gate thin film transistor.

In an exemplary embodiment of the present invention, a thin film transistor includes: an insulating substrate; a gate electrode formed on the substrate; a gate insulating layer formed on the gate electrode; a polysilicon layer formed on the gate insulating layer and crystallized by an SGS crystallization method; and source and drain regions and source and drain electrodes formed in a predetermined region of the substrate.

In addition, the etch stopper may be formed to have a width at least larger than that of a channel region of the polysilicon layer.

In another exemplary embodiment of the present invention, a method of fabricating a thin film transistor includes: preparing an insulating substrate; forming a gate electrode on the substrate; forming a gate insulating layer on the gate electrode; forming an amorphous silicon layer and a capping layer on the gate insulating layer; forming a metal catalyst layer on the capping layer; performing a heat-treatment on the substrate to crystallize the amorphous silicon layer into a polysilicon layer; and forming source and drain regions and source and drain electrodes on the substrate.

In addition, after the polysilicon layer is formed, an etch stopper may be formed by patterning the capping layer.

In addition, after the polysilicon layer is formed, an etch stopper may be formed by removing the capping layer, forming an insulating layer and then patterning the formed insulating layer.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

Figure 1A:
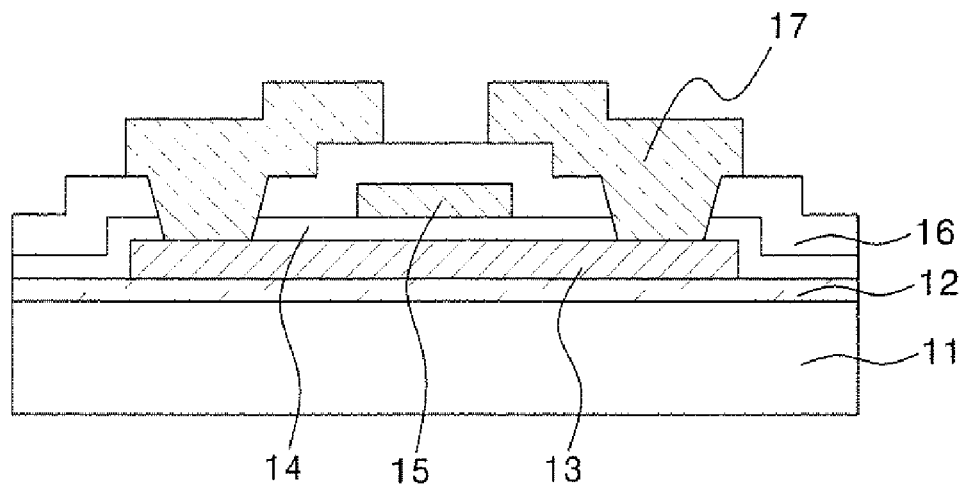
FIGS. 1A and 1B are cross-sectional views illustrating a fabrication process of a conventional thin film transistor.
Figure 1B:
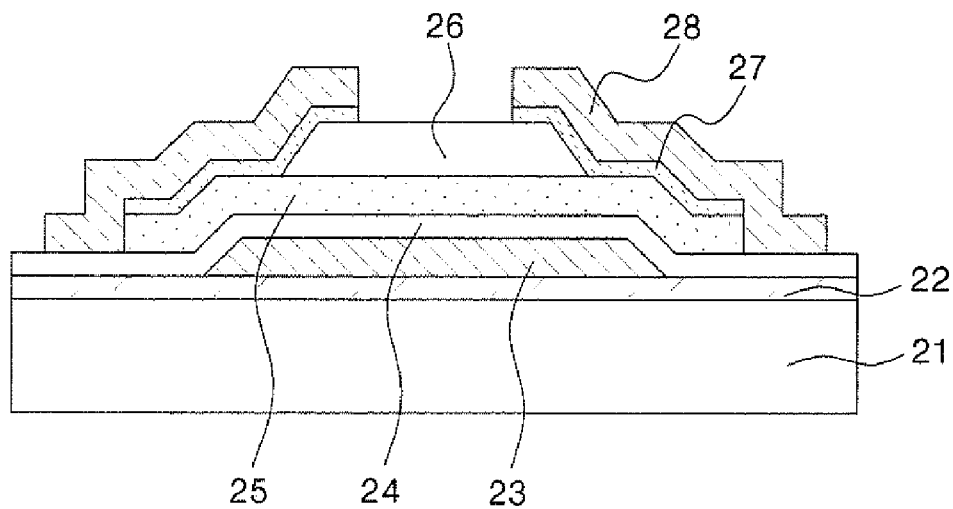

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

FIRST EMBODIMENT

FIGS. 2A to 2D are cross-sectional views illustrating a process of fabricating a thin film transistor according to a first embodiment of the present invention.

Figure 2A:
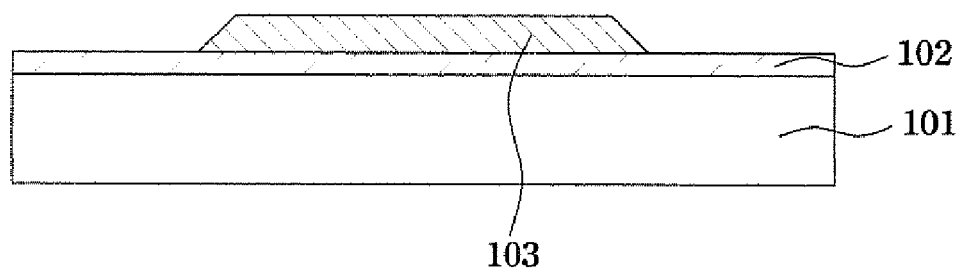
FIGS. 2A to 2D are cross-sectional views illustrating a process of fabricating a thin film transistor according to a first embodiment of the present invention.

FIG. 2A is a cross-sectional view of a process of forming a buffer layer and a gate electrode on a substrate. As shown in FIG. 2A, a buffer layer 102 is formed on a transparent insulating substrate 101 such as glass or plastic, and a material for forming a gate electrode is formed on the buffer layer 102 and patterned to form a gate electrode 103. Here, the buffer layer 102 serves to prevent moisture or impurity generated from the lower substrate from diffusing.

Figure 2B:
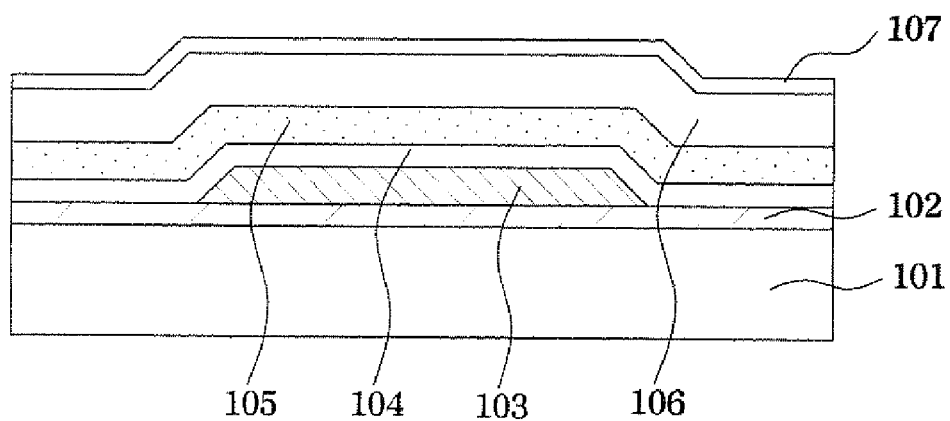

FIG. 2B is a cross-sectional view of a process of sequentially forming a gate insulating layer, an amorphous silicon layer, a capping layer and a metal catalyst layer on the substrate on which the gate electrode is formed. As shown in FIG. 2B, a gate insulating layer 104 is formed on the substrate on which the gate electrode 103 is formed in a single or double layer of a silicon oxide layer or a silicon nitride layer, and an amorphous silicon layer 105 is formed on the gate insulating layer 104. Here, the amorphous silicon layer 105 may be formed by a chemical vapor deposition or physical vapor deposition method. In addition, when or after the amorphous silicon layer 105 is formed, a dehydrogenation process may be performed to reduce a concentration of hydrogen.

Next, a capping layer 106 formed of a silicon oxide layer or a silicon nitride layer is formed on the amorphous silicon layer 105. Here, the capping layer 106 is preferably formed of a silicon nitride layer. This is because the metal catalyst is easily diffused into the silicon nitride layer other than the silicon oxide layer.

In FIG. 2B, the capping layer is formed after forming the amorphous silicon layer on the entire surface of the substrate. However, the capping layer 106 may be formed after patterning the amorphous silicon layer 105 to form an amorphous silicon layer pattern.

Next, a metal catalyst layer 107 is formed on the capping layer 106. Here, the metal catalyst layer 107 is made of at least one selected from a group consisting of Ni, Pd, Ti, Ag, Au, Al, Sn, Sb, Cu, Co, Mo, Tr, Ru, Rh, Cd and Pt, using a deposition apparatus such as a sputter. The metal catalyst layer 107 herein is formed on the capping layer 106 at a sheet density of $10^{11}$ to $10^{15}$ atoms/cm$^2$. In addition, the metal catalyst layer 107 is preferably made of Ni because the Ni is most suitable for crystallizing the amorphous silicon layer 105 into a polysilicon layer.

Figure 2C:
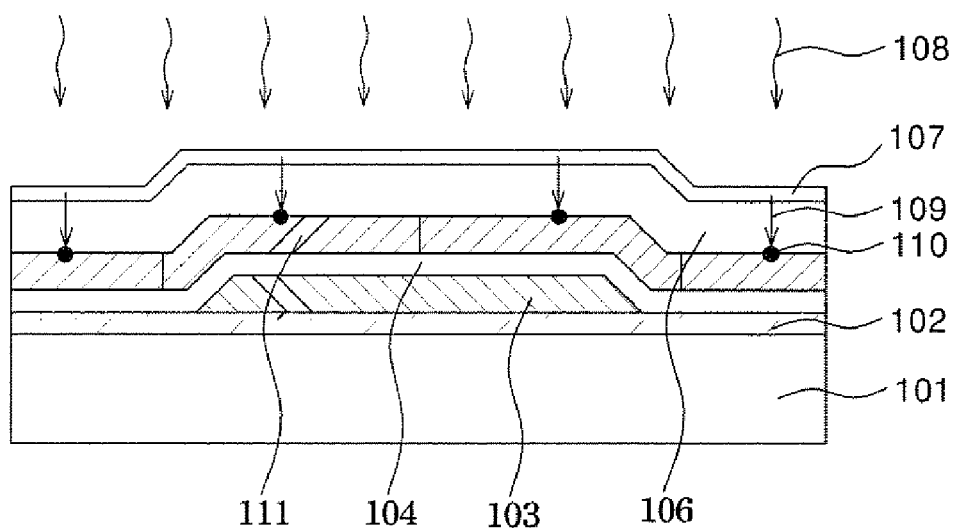

FIG. 2C is a cross-sectional view of a process of crystallizing the amorphous silicon layer into the polysilicon layer by performing heat-treatment on the substrate. As shown in FIG. 2C, through the heat-treatment 108 of the substrate, a metal catalyst in the metal catalyst layer 106 diffuses or penetrates 109 into the capping layer 106 and moves into an interface between the capping layer 106 and the amorphous silicon layer 105 to form a seed 110, which is the nucleus of the crystallization, so that the amorphous silicon layer 105 is crystallized into the polysilicon layer 111 by the seed 110. Here, the heat treatment process uses a process, capable of performing the heat-treatment on the capping layer 106 and the amorphous silicon layer 105 or on the entire surface of the substrate, such as a furnace, rapid thermal annealing (RTA), UV, plasma, or laser process.

Here, the heat-treatment process may be performed in two steps. A first heat-treatment process is a process that the metal catalyst moves into the interface between the capping layer 106 and the amorphous silicon layer 105 to form the seed 110, and a second heat-treatment process is a process that the amorphous silicon layer 105 is crystallized into the polysilicon layer 111 by the seed 110. Here, the first heat-treatment process is performed at a temperature of 200 to 800° C., and the second heat-treatment process is performed at a temperature of 400 to 1300° C. In addition, after performing the first heat-treatment process, the metal catalyst layer 107 is removed to prevent the metal catalyst from diffusing or penetrating during the second heat-treatment process.

Therefore, according to the number, density and location of the seed generated on the interface between the capping layer 106 and the amorphous silicon layer 105, the size and uniformity of the grains in the polysilicon layer 111 are determined. However, this may be also determined by the diffusion characteristics of the metal catalyst in the capping layer 106 as well as the density of the metal catalyst layer. In other words, as the density of the metal catalyst layer 107 is lowered and the diffusion of the metal catalyst in the capping layer 106 is reduced, the grains in the polysilicon layer 111 become larger. However, when the amount of diffusion is extremely small, the crystallization may not be performed at all. Therefore, there should be given a suitable amount of diffusion.

Here, a method in which the metal catalyst layer 107 and the capping layer 106 that controls the diffusion or penetration of the metal catalyst is formed on the amorphous silicon layer 105 and heat-treated as described above, and the amorphous silicon layer 105 is then crystallized into the polysilicon layer 111 having a large grain size is referred to a super grain silicon (SGS) crystallization method.

Figure 2D:
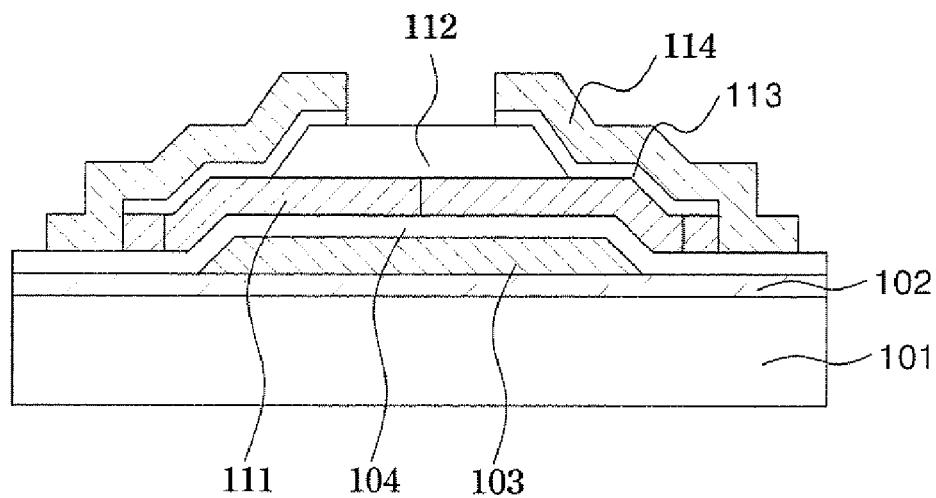

FIG. 2D is a cross-sectional view of a process of forming source and drain regions and source and drain electrodes on the substrate. As shown in FIG. 2D, an etch stopper 112 is formed by patterning the capping layer 106, or by removing the capping layer followed by depositing and patterning an insulating layer such as a silicon oxide layer or a silicon nitride layer.

Here, since the capping layer 106 is formed of an insulating layer such as a silicon oxide layer or a silicon oxide layer, it is not necessary to form the etch stopper 112 again. Therefore, it is desirable that the etch stopper 112 is formed by etching the capping layer 106. Further, the capping layer 106 contains a metal catalyst in a very small amount. However, the metal catalyst does not affect the thin film transistor at all, so that the very small amount of metal catalyst may be disregarded. The interface between the polysilicon layer and the gate insulating layer, which is the most important region in the polysilicon layer, is on the opposite side to the interface between the polysilicon layer and the gate insulating layer (i.e., interface between the capping layer and the polysilicon layer), where the very small amount of metal catalyst may affect. Therefore, it may be appreciated that there is little problem caused by the remaining metal.

Here, the polysilicon layer below the region where the etch stopper 112 is formed is defined as a channel region.

Next, as shown in FIG. 2D, a highly doped silicon layer 113 is deposited on the substrate 101 and patterned to define source and drain regions, and then, a material for forming source and drain electrodes is deposited and patterned to form the source and drain electrodes 114. Alternatively, although not shown, the highly doped silicon layer 113 and the source and drain electrode forming material are sequentially deposited, and then are simultaneously etched to form the source and drain regions and the source and drain electrodes at the same time.

Here, when the highly doped silicon layer 113 and the source and drain electrode forming material are etched, the etch stopper 112 serves to prevent the polysilicon layer (in particular, the channel region) from being etched or damaged. The above process is referred to an etch stopper (E/S) etching process in which the source and drain electrode forming material and the highly doped silicon layer are etched to form the source and drain electrodes and the source and drain regions.

Therefore, when the thin film transistor is fabricated by the processes described with reference to FIGS. 2A to 2D, the interface between the polysilicon layer and the gate insulating layer is not exposed so that a clean interface may be obtained. In addition, the polysilicon layer having a large grain size may be used as a channel region through the SGS crystallization method, so that the thin film transistor having good leakage current characteristics and large electron mobility may be fabricated by a simple process.

SECOND EMBODIMENT

FIGS. 3A to 3D are cross-sectional views illustrating a process of fabricating a thin film transistor according to a second embodiment of the present invention.

Figure 3A:
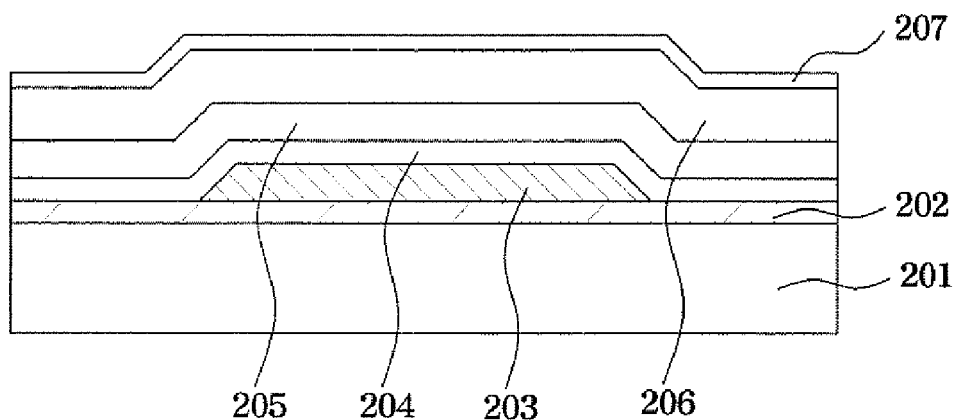
FIGS. 3A to 3D are cross-sectional views illustrating a process of fabricating a thin film transistor according to a second embodiment of the present invention.

FIG. 3A is a cross-sectional view of a process of sequentially forming a buffer layer, a gate electrode, a gate insulating layer, an amorphous silicon layer, a capping layer and a metal catalyst layer on a substrate. As shown in FIG. 3A, a buffer layer 202 is formed on a transparent insulating substrate 201 such as glass or plastic, and a material for forming a gate electrode forming is deposited on the buffer layer 202 and patterned to form a gate electrode 203, in the same manner as that described in the first embodiment.

Next, a gate insulating layer 204 made of a silicon oxide layer or a silicon nitride layer in a single or double layer is formed on the substrate 201, and an amorphous silicon layer 205 is formed on the gate insulating layer 204.

Next, a capping layer 206 made of a silicon oxide layer or a silicon nitride layer is formed on the amorphous silicon layer 205.

In FIG. 3A, the capping layer 206 is formed after forming the amorphous silicon layer 205 on the entire surface of the substrate. However, the capping layer 206 may also be formed after patterning the amorphous silicon layer 205 to form an amorphous silicon layer pattern.

Next, a metal catalyst layer 207 is formed on the capping layer 206. Here, the metal catalyst layer 207 is made of at least one selected from a group consisting of Ni, Pd, Ti, Ag, Au, Al, Sn, Sb, Cu, Co, Mo, Tr, Ru, Rh, Cd and Pt, using a deposition apparatus such as a sputter. The metal catalyst layer 207 herein is formed on the capping layer 206 at a sheet density of $10^{11}$ to $10^{15}$ atoms/cm². In addition, the metal catalyst layer 207 is preferably made of Ni because the Ni is the most suitable for crystallizing the amorphous silicon layer 205 into a polysilicon layer.

Figure 3B:
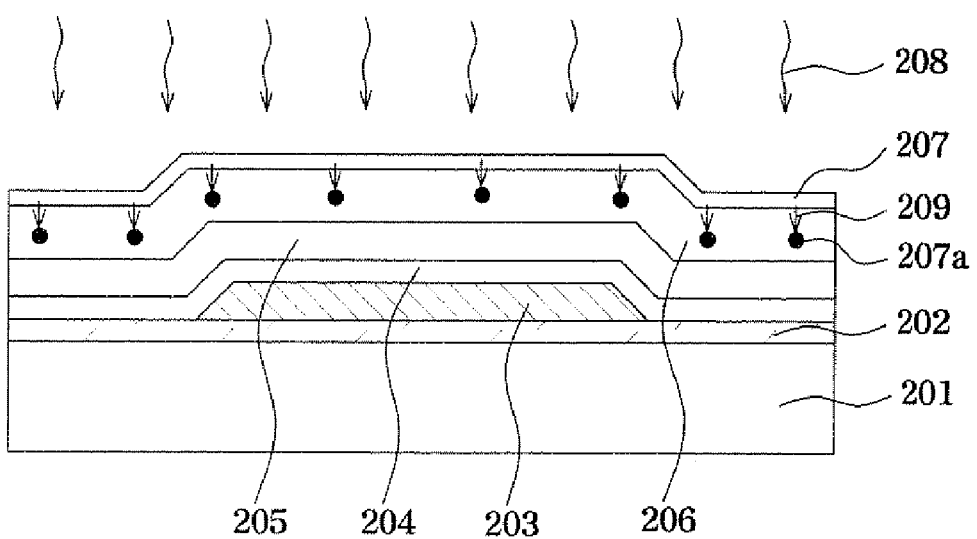

FIG. 3B is a cross-sectional view of a process of performing the third heat-treatment on the substrate. As shown in FIG. 3B, through the third heat-treatment 208 of the substrate, metal catalysts 207a in the metal catalyst layer are diffused or penetrated 209 into the capping layer 206. Here, it is desirable that the metal catalysts 207a diffused or penetrated into the capping layer 206 are not be moved to an interface between the amorphous silicon layer 205 and the capping layer 206. In other words, the heat-treatment is performed not so as to form the seed at the interface between the amorphous silicon layer 205 and the capping layer 206 as in the first heat treatment of the first embodiment, but performed so as to allow the metal catalysts to move into the capping layer 206. This is for controlling positions, density, or the number of seeds that derive crystallization by patterning the capping layer 206 later.

Here, the third heat treatment process is performed at a temperature of 200 to 800° C.

Figure 3C:
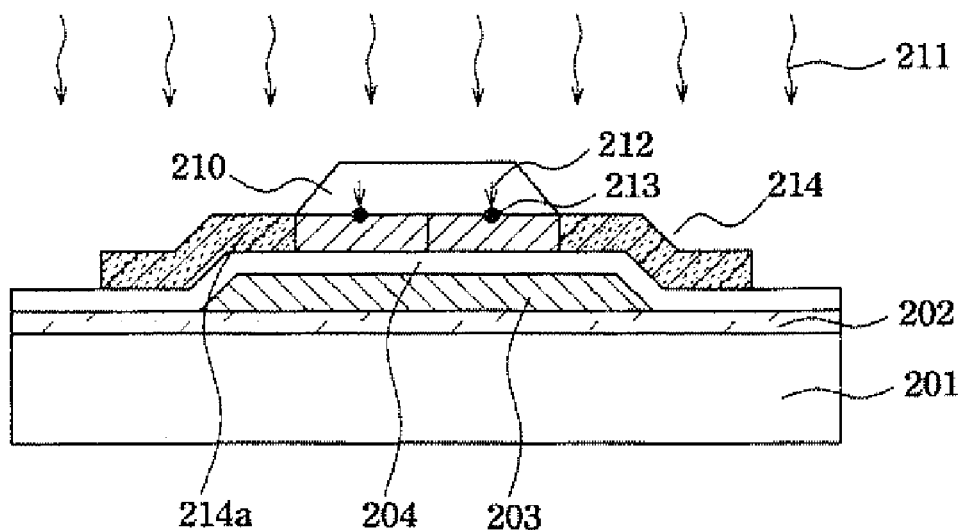

FIG. 3C is a cross-sectional view of a process of patterning the capping layer to form an etch stopper and then performing an ion implantation process and a crystallization process. As shown in FIG. 3C, the capping layer 206 having the metal catalyst is patterned to form an etch stopper 210. Here, the width of the etch stopper 210 defines a channel region of the thin film transistor, so the etch stopper 210 needs to be formed in an appropriate width. In addition, the etch stopper described in the present invention includes the metal catalyst so that the grain size of the polysilicon layer is determined according to the size of the etch stopper 210. Thus, the etch stopper should be formed considering this.

Next, the ion implantation process and the crystallization process are progressed, either of which may be performed first. In other words, the ion implantation process is processed using the etch stopper 210 as a mask to define source and drain regions 214a, and the fourth heat-treatment is performed on the substrate 201 to proceed the crystallization process that crystallizes the amorphous silicon layer 205 into the polysilicon layer. In addition, it is also possible to perform the crystallization process, and then perform the ion implantation process. However, when the ion implantation process is performed first, the impurities implanted during the crystallization process are simultaneously activated. Therefore, advantageously, it is not necessary to perform the impurity activation process separately.

At this time, as the ion implantation process is performed, the highly doped silicon layer is not required to be formed.

Here, as shown in FIG. 3C, the crystallization process is performed as follows: the fourth heat-treatment process 211 is performed on the metal catalyst diffused or penetrated into the etch stopper (a portion of the capping layer) by the third heat-treatment process, and the metal catalyst is moved 212 into an interface between the etch stopper and the amorphous silicon layer to form a seed 213 for crystallization, and then the amorphous silicon layer is crystallized into the polysilicon layer 214 using the seed 213. In FIG. 3C, two seeds are formed so that two grains are formed in the polysilicon layer 214. However, only one seed may be formed to crystallize the amorphous silicon layer into the single crystal silicon layer by appropriately controlling the processes of forming the metal catalyst layer and performing the third heat-treatment process, or controlling the width of the etch stopper 210. Alternatively, several seeds may be uniformly formed to increase uniformity in the grain size of the polysilicon layer.

Here, the fourth heat-treatment process is performed at a temperature of about 400 to 1300° C. In addition, the third or fourth heat-treatment process is a process, capable of performing the heat-treatment on the capping layer 206 and the amorphous silicon layer 205 or on the entire surface of the substrate, such as a furnace, RTA, UV, plasma, or laser process.

Figure 3D:
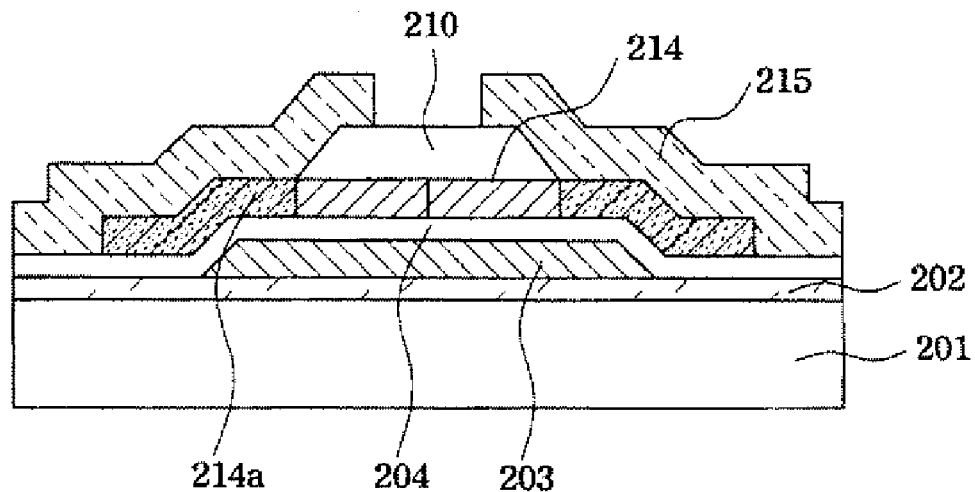

FIG. 3D is a cross-sectional view of a process of forming source and drain electrodes on the substrate. As shown in FIG. 3D, a material for forming source and drain electrodes is deposited on the entire surface of the substrate, and patterned by an E/S etching process to form source and drain electrodes 215, so that the thin film transistor is finally obtained.

Therefore, when the thin film transistor is fabricated by the processes described with reference to FIGS. 3A to 3D, the interface between the polysilicon layer and the gate insulating layer is not exposed so that a clean interface may be obtained. In addition, the polysilicon layer having a large grain size may be used as a channel region through the SGS crystallization process, so that the thin film transistor having good leakage current characteristics and large electron mobility may be fabricated by a simple process. Furthermore, the source and drain regions may be formed by the ion implantation process, without separately forming the highly doped silicon layer.

THIRD EMBODIMENT

Figure 4A:
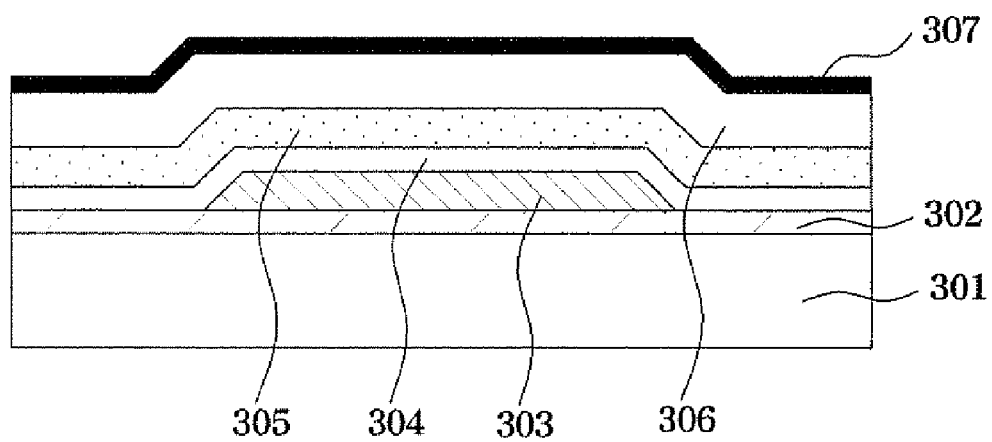
FIGS. 4A to 4C are cross-sectional views illustrating a process of fabricating a thin film transistor according to a third embodiment of the present invention.
Figure 4B:
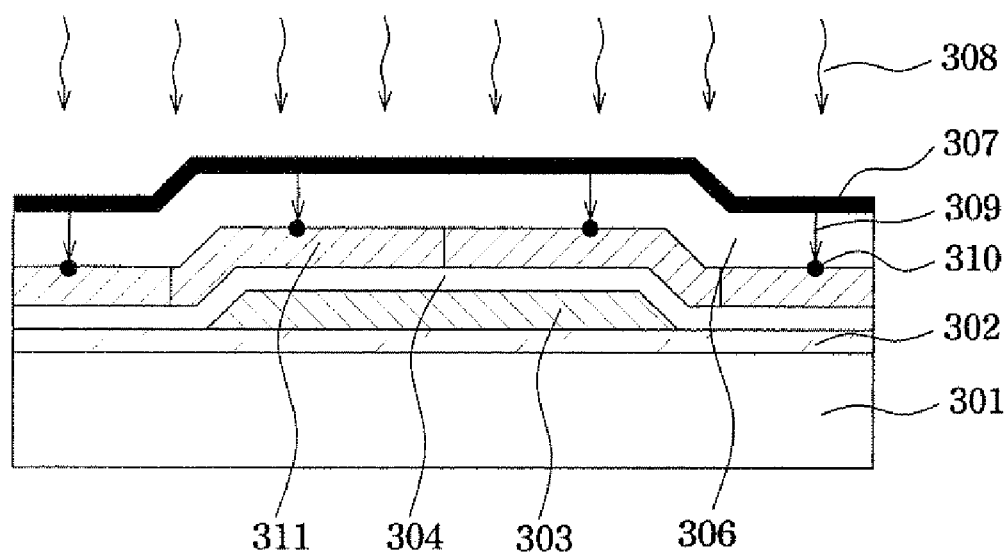
Figure 4C:
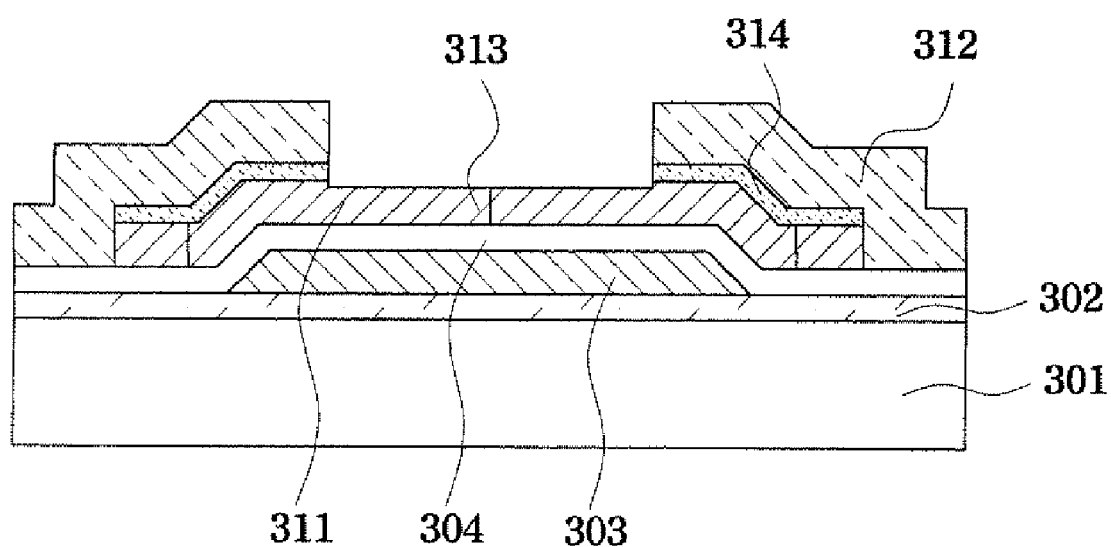

FIGS. 4A to 4C are cross-sectional views illustrating a process of fabricating a thin film transistor according to a third embodiment of the present invention.

FIG. 4A is a cross-sectional view of a process of sequentially forming a buffer layer, a gate electrode, a gate insulating layer, an amorphous silicon layer, a capping layer and a metal catalyst layer on a substrate. As shown in FIG. 4A, a buffer layer 302 is deposited on a transparent insulating substrate 301 such as glass or plastic, and a material for forming a gate electrode is deposited on the buffer layer 302 and patterned to form a gate electrode 303, in the same manner as that described in the first embodiment.

Next, a gate insulating layer 304 made in a single or double layer of a silicon oxide layer or a silicon nitride layer is formed on the substrate 301, and an amorphous silicon layer 305 is formed on the gate insulating layer 304.

Next, a capping layer 306 made of a silicon oxide layer or a silicon nitride layer is formed on the amorphous silicon layer 305.

In FIG. 4A, the capping layer 306 is formed after forming the amorphous silicon layer 305 on the entire surface of the substrate. However, the capping layer 306 may also be formed after patterning the amorphous silicon layer 305 to form an amorphous silicon layer pattern.

Next, a metal catalyst layer 307 is formed on the capping layer 306. Here, the metal catalyst layer 307 is made of at least one selected from a group consisting of Ni, Pd, Ti, Ag, Au, Al, Sn, Sb, Cu, Co, Mo, Tr, Ru, Rh, Cd and Pt, using a deposition apparatus such as a sputter. The metal catalyst layer 307 herein is formed on the capping layer 306 at a sheet density of $10^{11}$ to $10^{15}$ atoms/cm$^2$. In addition, the metal catalyst layer 307 is preferably made of Ni because the Ni is the most suitable for crystallizing the amorphous silicon layer 305 into a polysilicon layer.

FIG. 4B is a cross-sectional view of a process of performing a heat-treatment process on the substrate to crystallize the amorphous silicon layer into the polysilicon layer. As shown in FIG. 4B and as described in the first embodiment, through the heat-treatment 308 of the substrate, a metal catalyst in the metal catalyst layer 307 diffuses or penetrates 309 into the capping layer 306 and moves into an interface between the capping layer 306 and the amorphous silicon layer 305 to form a seed 310, which is the nucleus of the crystallization, so that the amorphous silicon layer 305 is crystallized into the polysilicon layer 311 by the seed 310. Here, the heat treatment process uses a process, capable of performing the heat-treatment on the capping layer 306 and the amorphous silicon layer 305, or on the entire surface of the substrate, such as a furnace, RTA, UV, plasma, or laser process.

Here, the heat-treatment process may be performed in two steps. A first heat-treatment process is a process of moving the metal catalyst into an interface between the capping layer 306 and the amorphous silicon layer 305 to form the seed 310, and the second heat-treatment process is a process of crystallizing the amorphous silicon layer 305 into the polysilicon layer by the seed 310. Here, the first heat-treatment process is performed at a temperature of about 200 to 800° C., and the second heat-treatment process is performed at a temperature of about 400 to 1300° C. In addition, after the first heat-treatment process, the metal catalyst layer 307 is removed to prevent the metal catalyst from diffusing or penetrating during the second heat-treatment process.

Therefore, according to the number, density and location of the seed generated on the interface between the capping layer 306 and the amorphous silicon layer 305, the size and uniformity of the polysilicon layer are determined. However, this may be also determined by the diffusion characteristics of the metal catalyst in the capping layer 306 as well as the density of the metal catalyst layer 307. In other words, as the density of the metal catalyst layer 307 is lowered and the diffusion of the metal catalyst in the capping layer is reduced, the size of the polysilicon layer becomes larger. However, when the amount of diffusion is extremely small, the crystallization may not be performed at all. Therefore, there should be performed a suitable amount of diffusion.

FIG. 4C is a cross-sectional view of a process of forming source and drain electrodes and a highly doped silicon layer on the substrate. As shown in FIG. 4C, after crystallizing the amorphous silicon layer 305 into the polysilicon layer by the heat-treatment process, the capping layer 306 is removed.

Next, a highly doped silicon layer is formed either by implanting the impurity into the polysilicon layer, or by depositing the highly doped silicon layer.

Next, the highly doped silicon layer and the polysilicon layer are patterned, a material for forming source and drain electrodes is deposited on the entire surface of the substrate, and an etching process is performed to define source and drain electrodes 312, a channel region 313 and source and drain regions 314 so that the thin film transistor is finally obtained. Here, the etching process for defining the channel region is performed by further etching portions of the polysilicon layer as well as the highly doped silicon layer. With only the aforementioned pattern, a process in which the source and drain electrodes forming material, the highly doped silicon layer and a portion of the channel region are etched and removed to form the respective regions is referred to as an E/B (etch back) etching process.

Therefore, when the thin film transistor is fabricated by the aforementioned process described with reference to FIGS. 4A to 4C, the interface between the polysilicon layer and the gate insulating layer is not exposed so that a clean interface may be obtained. Moreover, the polysilicon layer having a large grain may be used for the channel region through the SGS crystallization process, so that the thin film transistor having good leakage characteristics and large electron mobility may be fabricated by a simple process.

As described, a method of fabricating the conventional top-gate thin film transistor has problems in that an interface between a channel region and a gate insulating layer is directly exposed to air or directly in contact with a photoresist pattern or etchant so that the thin film transistor may be contaminated by impurities such as oxide, organic and metal, or damaged in grains, and in that the metal catalyst remains at the interface during the crystallization process so that leakage current may occur. However, advantageously, a method of fabricating the bottom-gate thin film transistor according to the present invention has merits in that an interface between the channel region and the gate insulating layer is not exposed so that the aforementioned problems do not occur. Therefore, the thin film transistor having excellent characteristics may be fabricated and fabrication process thereof may be simplified.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method of fabricating a thin film transistor, comprising:
   preparing a substrate;
   forming a gate electrode on the substrate;
   forming a gate insulating layer on the gate electrode;
   forming an amorphous silicon layer and a capping layer on the gate insulating layer;
   forming a metal catalyst layer on the capping layer;
   performing a first heat treatment process on the substrate to diffuse or penetrate a metal catalyst into the capping layer;
   patterning the capping layer to form a capping layer pattern;
   performing a second heat treatment process on the substrate to crystallize the amorphous silicon layer into the polysilicon layer.

2. The method according to claim 1, further comprising, after patterning the capping layer to form a capping layer pattern, forming source and drain regions by an ion implantation process using the capping pattern as a mask.

3. The method according to claim 2, wherein forming of the source and drain regions includes:
   forming a highly doped silicon layer on the substrate; and patterning the silicon layer.

4. The method according to claim 1, further comprising, after performing the second heat treatment process on the substrate to crystallize the amorphous silicon layer into the polysilicon layer, forming source and drain regions by an ion implantation process using the capping layer pattern as a mask.

5. The method according to claim 1, wherein the capping layer pattern is an etch stopper.

6. The method according to claim 1, wherein the first heat treatment process is performed at a temperature of 200 to 800° C. and the second heat treatment process is performed at a temperature of 400 to 1300° C.

7. The method according to claim 1, wherein the metal catalyst layer includes a metal catalyst formed at a sheet density of $10^{11}$ to $10^{15}$ atoms/cm$^2$.

8. The method according to claim 1, wherein the polysilicon layer includes a metal catalyst remaining at a sheet density of $10^9$ to $10^{13}$ atoms/cm$^2$.

9. The method according to claim 1, wherein forming the metal catalyst layer is performed by depositing at least one selected from a group consisting of Ni, Pd, Ti, Ag, Au, Al, Sn, Sb, Cu, Co, Mo, Tr, Ru, Rh, Cd and Pt.

* * * * *